(12) United States Patent
Wimmer

(10) Patent No.: US 6,948,242 B2
(45) Date of Patent: Sep. 27, 2005

(54) PROCESS FOR PRODUCING A CONTACT-MAKING DEVICE

(75) Inventor: Anton Wimmer, Bad Tölz (DE)

(73) Assignee: Infineon Technologies AG, Munich (DE)

(*) Notice: Subject to any disclaimer, the term of this patent is extended or adjusted under 35 U.S.C. 154(b) by 22 days.

(21) Appl. No.: 10/213,750

(22) Filed: Aug. 6, 2002

(65) Prior Publication Data

US 2002/0184759 A1 Dec. 12, 2002

Related U.S. Application Data

(62) Division of application No. 09/789,971, filed on Feb. 20, 2001, now abandoned, which is a continuation of application No. PCT/DE99/02564, filed on Aug. 16, 1999.

(30) Foreign Application Priority Data

Aug. 17, 1998 (DE) .......................................... 198 37 246

(51) Int. Cl.$^7$ ............................................... H01R 43/02
(52) U.S. Cl. ............................. 29/879; 29/825; 29/830; 29/852; 29/874; 29/876
(58) Field of Search ....................... 29/825, 830, 852, 29/874, 876, 879, 848, 882

(56) References Cited

U.S. PATENT DOCUMENTS

| | | |
|---|---|---|
| 2,853,656 A | 9/1958 | Dowds |
| 3,268,653 A | 8/1966 | McNutt |
| 3,318,993 A | 5/1967 | Beelitz |
| 3,419,844 A | 12/1968 | Schmued |
| 3,680,037 A * | 7/1972 | Nellis et al. |
| 3,954,317 A | 5/1976 | Gilissen et al. |
| 4,003,621 A | 1/1977 | Lamp |
| 4,082,399 A | 4/1978 | Barkhuff |
| 4,199,209 A | 4/1980 | Cherian et al. |
| 4,295,700 A * | 10/1981 | Sado |
| 4,707,657 A | 11/1987 | Boegh-Petersen |
| 4,793,814 A * | 12/1988 | Zifcak et al. |
| 4,992,053 A | 2/1991 | Lindeman et al. |
| 4,998,885 A * | 3/1991 | Beaman |
| 5,192,213 A | 3/1993 | Kosugi et al. |
| 5,324,205 A | 6/1994 | Ahmad et al. |
| 5,417,577 A | 5/1995 | Holliday et al. |
| 5,585,138 A | 12/1996 | Inasaka |
| 5,590,460 A * | 1/1997 | DiStefano et al. |
| 5,645,433 A | 7/1997 | Johnson |
| 5,800,184 A * | 9/1998 | Lopergolo et al. |
| 5,810,607 A * | 9/1998 | Shih et al. |
| 6,102,709 A | 8/2000 | Howard et al. |
| 6,168,442 B1 | 1/2001 | Naoi |
| 6,193,524 B1 | 2/2001 | Chang |
| 6,278,285 B1 | 8/2001 | Weber et al. |
| 6,290,507 B1 | 9/2001 | Neidich et al. |

FOREIGN PATENT DOCUMENTS

| | | |
|---|---|---|
| DE | 31 51 933 A1 | 7/1983 |
| EP | 0 591 772 A1 | 4/1994 |
| EP | 0 593 966 A1 | 4/1994 |
| JP | 5 283 865 | 10/1993 |
| JP | 08 273 726 | 10/1996 |
| WO | 95/34106 | 12/1995 |

* cited by examiner

*Primary Examiner*—Carl J. Arbes
(74) *Attorney, Agent, or Firm*—Laurence A. Greenberg; Werner H. Stemer; Ralph E. Locher

(57) ABSTRACT

A process for producing a contact-making device is provided for making electrical contact between components, which includes the step of producing an electrical zero-insertion-force connector which further includes the step of forming an elastic dielectric with at least two elastic dielectric layers and at least one structured metal layer disposed between the two elastic dielectric layers. The elastic dielectric has an upper side and an underside being the upper side and the underside, respectively, of the zero-insertion-force connector. The process also includes the step of structuring the elastic dielectric, forming a number of contact points on the upper side and the underside of the zero-insertion-force connector; and forming a number of electrically conducting connections in and through the elastic dielectric such that the electrically conducting connections connect a number of the contact points to one another.

3 Claims, 2 Drawing Sheets

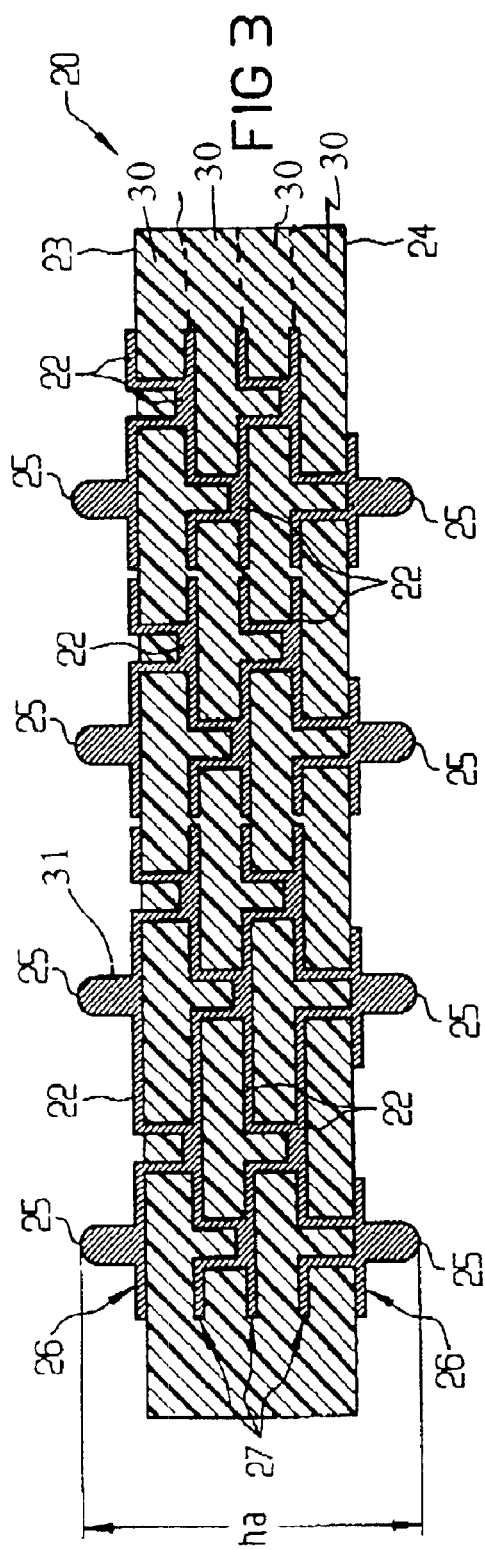
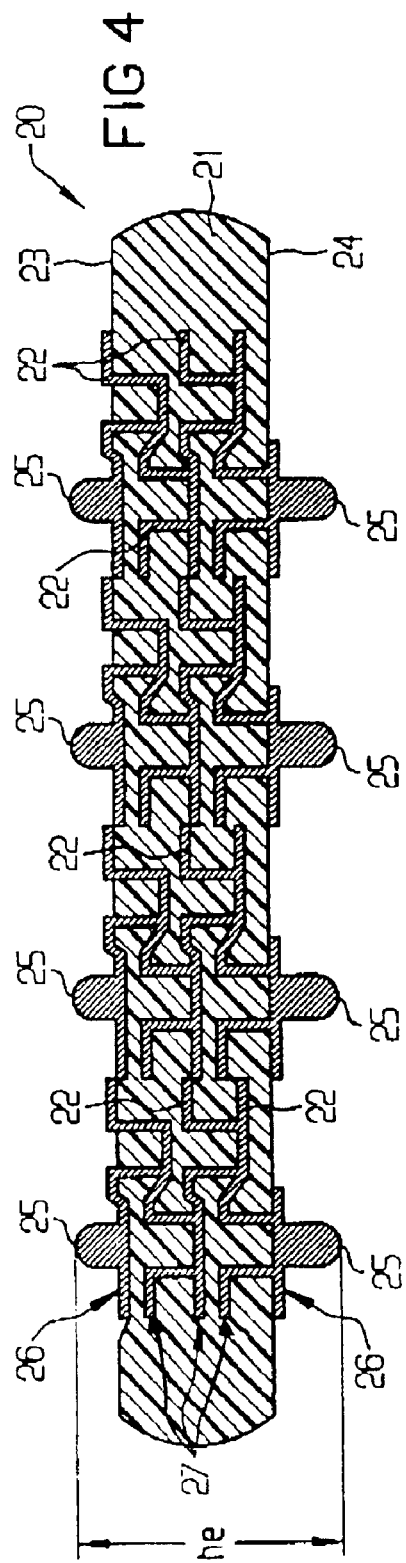

PROCESS FOR PRODUCING A CONTACT-MAKING DEVICE

CROSS-REFERENCE TO RELATED APPLICATION

This application is a divisional of U.S. application Ser. No. 09/789,971, filed Feb. 20, 2001 now abandoned, which was a continuation of International Application No. PCT/DE99/02564, filed Aug. 16, 1999, which designated the United States and which was not published in English.

BACKGROUND OF THE INVENTION

Field of the Invention

The present invention relates to a process for producing a contact-making device, in particular for making contacts between electrical components in electrical subassemblies and lead frames, such as printed-circuit boards, multi-chip modules (MCM), flexible circuits or the like.

In the production of electrical subassemblies, so-called zero-insertion-force connectors or contact-making devices configured for example as "conductive rubber films" have previously been used for making releasable contacts between packaged and unpackaged components and displays and lead frames, such as printed-circuit boards or the like. These conductive rubber films are generally elastomers filled with metal particles or carbon particles, thereby producing electrical conductivity. Furthermore, special elastic contact-making devices that are filled with wire clews as contact elements are used.

However, all the known contact-making devices have the disadvantage that they require high pressing forces, sometimes extremely high pressing forces, to ensure that reasonably good contact is made. Furthermore, the known devices have relatively high contact resistances and internal resistances. Finally, with the known devices, contact can be made only inadequately with components in depressions of the lead frames, as occur for example in the case of surfaces provided with solder resist.

SUMMARY OF THE INVENTION

It is accordingly an object of the invention to provide a process for producing a contact-making device, in particular for making contact between electrical components and lead frames, which overcomes the above-mentioned disadvantages of the prior art devices and methods of this general type, in which it is possible to make contacts between electrical components and lead-frames dependably, inexpensively and very accurately.

With the foregoing and other objects in view there is provided, in accordance with the invention, a contact-making device for making electrical contact between components. The contact-making device contains a zero-insertion-force connector having an elastic dielectric with an underside and an upper side forming an underside and an upper side, respectively, of the zero-insertion-force connector. The elastic dielectric is formed of at least one elastic dielectric layer each having an underside and an upper side. Contact points are disposed on both the upper side and the underside of the zero-insertion-force connector. Electrically conducting connections are disposed in the elastic dielectric and each of the electrically conducting connections respectively connecting a number of the contact points to one another. A structured metal layer is disposed on one of the underside and the upper side of at least one layer of the elastic dielectric. The electrically conducting connections connect the structured metal layer to the contact points on an oppositely lying one of the underside and the upper side of the zero-insertion-force connector.

The object is achieved according to a first aspect of the invention by a contact-making device, in particular for making contacts between electrical components and lead frames. The contact making device has an electrical zero-insertion-force connector having an elastic dielectric, a number of electrically conducting connections formed in the electrical zero-insertion-force connector and a number of contact points are disposed on the upper side and underside of the electrical zero-insertion-force connector. The contact points are connected via the connections.

The electrical contact-making device according to the invention is distinguished first by the fact that high contact-making dependability is ensured. At the same time, the necessary contact forces can be kept relatively low. This leads to a reduction in the risk of damage to the components and the contact-making device. Furthermore, the contact-making device can be adapted to the corresponding configuration and layout of the components for which contacts are to be made. The contact-making device is elastic, and therefor can be used even for very small connection patterns and contact areas and can be produced inexpensively in high numbers. In addition, targeted contact-making between the respective contact points on the components and lead frames is possible.

The contact-making device can be produced virtually irrespective of its size in modern printed-circuit board and MCM production operations, since they have a similar structure.

The contact-making device establishes in particular a releasable electrical connection between components and the lead frames that allows individual components to be exchanged or replaced.

The connections within the elastic electrical zero-insertion-force connector can be established for example by the so-called "micro-via technique", for instance by laser structuring or the like.

The way in which the individual connections are configured within the elastic electrical zero-insertion-force connector, a possible linking of the connections among one another and the linking of the connections to the individual contact points can be performed according to the application area and requirements. Individual examples, which are however of a purely exemplary nature and are not to be understood as exclusive, are described further below in greater detail.

According to the invention, the elastic dielectric may be formed from silicone rubber or polyurethane. Of course, the invention is not restricted to the use of these two materials. Rather, any material that is on the one hand elastic and on the other hand electrically insulating can be used.

In a further development, the contact points can in each case protrude beyond the plane of the upper side and underside of the electrical zero-insertion-force connector. This makes it possible, on the one hand, to compensate in a simple way for differences in level in the surfaces of the components, lead-frames and the like for which contacts are to be made. In addition, contact-making can also be performed in depressions of the components and lead-frames in a reliable and dependable way, which was possible only inadequately with the previously known contact-making devices.

The surfaces of the contact points may advantageously have a metal coating, preferably a gold coating. As a result, the contact-making dependability is further increased. Of course, other metals are also conceivable as a coating.

According to the invention, individual contact points which are respectively disposed on the upper side and underside of the electrical zero-insertion-force connector can be connected to one another via the connections. In a preferred development, those contact points that are disposed at positions respectively lying directly opposite one another on the upper side and underside of the electrical zero-insertion-force connector are connected to one another via the connections. Depending on requirements and the application, it may also be advisable, however, to connect contact points respectively located offset in relation to one another on the upper side and underside to one another via the connections. The present invention is not restricted to any specific interconnection of the individual contact points on the upper side and underside of the electrical zero-insertion-force connector. Rather, the required interconnection is governed by the connection patterns and contact areas to be provided with contacts of the components for which contacts are to be made.

In a further development, individual contact points which are respectively disposed next to one another on the upper side and/or underside of the electrical zero-insertion-force connector are connected to one another via the connections. As a result, even extremely small connection patterns and contact areas of the components can be provided with contacts in an even easier way.

The connections in the electrical zero-insertion-force connector may advantageously form a three-dimensional circuit system. As a result, the so-called "translator effect" can also be used if it is required. Such a "translator effect" is needed in particular if there is a very fine connection pattern on the component for which contacts are to be made, while the lead-frame has a coarser pattern. The three-dimensional circuit system allows the contact-making dependability to be further increased. In addition, one and the same contact-making device can be used universally, even for making contacts between extremely different components.

The three-dimensional circuit system may preferably have a meandering form.

In a further development, at least some of the connections may be disposed in releasable contact with respect to other connections in the electrical zero-insertion-force connector. This allows the linking of the electrically conducting connections within the elastic electrical zero-insertion-force connector to be varied according to the prevailing contact force. Therefore, different structures of the three-dimensional circuit system can be produced within the electrical zero-insertion-force connector. As a result, a variation of the connection of individual contact points is possible, whereby the flexibility in the making of contacts between various components and the contact-making dependability are further increased.

According to the invention, the electrical zero-insertion-force connector may be formed from one or more layers of an elastic dielectric. Depending on requirements, consequently thicker or thinner contact-making devices can be created, making it possible to compensate better for relatively great differences in level between the individual components and lead-frames.

In a further development, the lead-frame may have an electrically conducting layer, preferably a metal layer, on the upper side and/or underside. A preferred metal is copper, but other metals which are suitable as electrical conductors are also conceivable. Furthermore, the layer may also be produced from other electrically conducting materials and compositions. Silver conductive adhesive may be mentioned as one example of this.

If two or more dielectric layers are used, they too may have an electrically conducting layer, preferably a metal layer, on the upper side and/or underside. Here, too, use of the materials mentioned above is conceivable and possible.

The electrically conducting layer may preferably be formed as a foil. However, it may also be formed by screen printing, a special coating operation or the like.

In a further development, one or more layers of a photolithographic film may be provided on the upper side and/or the underside of the electrical zero-insertion-force connector.

According to the invention, the connections which are disposed in the electrical zero-insertion-force connector may be formed by a structuring of the dielectric layer(s), of the electrically conducting layer(s), if present, and of the photolithographic film(s), if present. Consequently, the connections can be established for example by the "micro-via technique", for instance by laser structuring, in a way similar to in the production of modern printed-circuit boards. This allows the contact-making device according to the invention to be produced in a particularly inexpensive way.

According to the invention, the contact points and/or the metal layer(s) may be electro-deposited. Furthermore, the connections within the electrical zero-insertion-force connector may also be electrolytically produced. Instead of the elements being electrolytically produced, other types of production, such as for example conductive paste printing or the like, are also possible.

The contact-making device according to the invention allows contacts to be made for electrical components in a simple and dependable way. The required contact force and the required contact path of the individual contact points can be set by the elasticity of the dielectric and the configuration of the circuit system containing the connections—and in this way for example by the number of translator layers present—and can be adapted to the prevailing circumstances.

The contact-making device may also be configured a ball grid array (BGA) or micro-BGA, which makes it possible for low-cost products and products of high volume to be mounted in an inexpensive way.

According to a second aspect of the present invention, a process is provided for producing the contact-making device, preferably for making contacts between electrical components and lead-frames, in particular for producing a contact-making device according to the invention as described above. The process is characterized according to the invention by the following steps:

a) producing an electrical zero-insertion-force connector with at least one layer of an elastic dielectric which is coated on the upper side and/or on the underside with an electrically conducting layer;

b) structuring the dielectric and the electrically conducting layer(s) and forming a number of electrically conducting connections in the electrical zero-insertion-force connector; and c) applying a number of contact points to the upper side and underside of the electrical zero-insertion-force connector, the contact points being connected to one another through the connections.

The process according to the invention allows the contact-making devices described above to be produced in a simple and inexpensive way. In respect of the advantages, results, effects and the functional mode of the process, reference is hereby made to the full content of the statements made above concerning the contact-making device.

The production of the electrical zero-insertion-force connector can take place for example by coating an electrically conducting layer, for instance a metal layer and here in particular a copper layer, with a liquid dielectric material. The coating may take place by casting (as in the case of solder resist), spraying, centrifuging, rolling or similar processes. Laminating on of partially polymerized dielectric films is also possible. Subsequently, a second metal layer is applied to the dielectric material on the side opposite the first metal layer and the dielectric is cured. Then the structuring of for forming the connections can be performed.

According to the invention, two or more layers of an elastic dielectric which are coated on the upper side and/or underside with an electrically conducting layer can be produced. After they have been structured, the individual layers of the dielectric are connected to one another to produce the electrical zero-insertion-force connector.

This also allows relatively thick contact-making devices to be created, which are of advantage in particular when compensating for relatively great differences in level of the individual components. The number of layers required depends on requirements and the application.

In a further development, the upper side and/or the underside of the dielectric layer(s) may be coated with at least one photolithographic film. The number of layers of photolithographic film to be used depends on requirements. The photolithographic film(s) may serve as protection for the components located thereunder. It may also be used for the structuring of the individual connections.

The structuring of the dielectric layer(s) and/or of the electrically conducting layer(s) and/or of the photolithographic film(s) may advantageously be performed by laser structuring—for example by laser drilling and/or photostructuring and/or by etching-structuring. However, other types of structuring are also conceivable.

According to the invention, the contact points may be built up electrolytically on the upper side and underside of the lead-frame. However, the other types of production, as described further above, are also conceivable.

The contact points may advantageously be coated with a metal layer, for example a gold layer.

In a further development, the making of contacts between the individual dielectric layers may also take place via the metal layer(s) to form the electrical zero-insertion-force connector.

In accordance with an added feature of the invention, the structured metal layer is provided on the upper side and the underside of at least one layer of the elastic dielectric. The electrically conducting connections connect the structured metal layer on the upper side to the structured metal layer on the underside.

In accordance with an additional feature of the invention, the at least one elastic dielectric layer is one of at least two elastic dielectric layers, the structured metal layer is disposed between the two elastic dielectric layers, and the electrically conducting connections connect the contact points which are offset laterally in relation to one another with respect to the elastic dielectric layers to one another through the structured metal layer.

In accordance with another feature of the invention, the at least one elastic dielectric layer is one of a plurality of elastic dielectric layers and the upper side and the underside of each of the elastic dielectric layers have disposed thereon a respective structured metal layer. The electrically conducting connections in each case connect the two structured metal layers to each other.

In accordance with a further feature of the invention, the contact points disposed next to one another on the upper side and on the underside of the zero-insertion-force connector are connected to one another through the electrically conducting connections.

In accordance with another added feature of the invention, the elastic dielectric is formed from silicone rubber or polyurethane.

In accordance with another additional feature of the invention, the contact points have surfaces and a gold coating is disposed on the surfaces of the contact points.

In accordance with another further feature of the invention, at least some of the electrically conducting connections are disposed in releasable contact with respect to others of the electrically conducting connections in the zero-insertion-force connector.

With the foregoing and other objects in view there is further provided, in accordance with the invention, a process for producing a contact-making device for making electrical contact between components. The process includes the step of forming a zero-insertion-force connector having an upper side and an underside. The zero-insertion-force connector is formed by the steps of:

providing an elastic dielectric having an upper side and an underside being the upper side and the underside, respectively, of the zero-insertion-force connector;

applying a metal layer to at least one of an upper side and an underside of a layer of the elastic dielectric;

structuring the elastic dielectric;

forming a number of contact points on the upper side and the underside of the zero-insertion-force connector; and forming a number of electrically conducting connections in and through the elastic dielectric such that the electrically conducting connections connect a number of the contact points to one another.

In accordance with an added mode of the invention, there is the step of applying the metal layer to the upper side and to the underside of the layer of the elastic dielectric.

In accordance with an additional mode of the invention, there are the steps of structuring a further layer of the elastic dielectric, forming additional ones of the electrically conducting connections in and through the further layer, and placing the further layer and the layer such that the electrically conducting connections are connected to one another such that the contact points on the upper side are connected in an electrically conducting manner to the contact points on the underside.

In accordance with a further mode of the invention, there is the step of applying the metal layer to both sides of the layer and the further layer of the elastic dielectric. The metal layers are connected to one another by making contacts being electrolytically made between the metal layers.

In accordance with another mode of the invention, there is the step of forming the electrically conducting connections as micro-vias.

In accordance with another added mode of the invention, there is the step of providing at least one layer of a photolithographic film on the upper side and/or the underside of the electrical zero-insertion-force connector.

In accordance with another additional mode of the invention, there is the step of forming an area for the electrically conducting connections by structuring the elastic dielectric, the metal layer, and/or the photolithographic film.

In accordance with another further mode of the invention, there is the step of forming the contact points and/or the metal layer by electro-depositing a metal.

In accordance with a further added mode of the invention, there is the step of forming the electrically conducting connections by an electrolytical production process.

With the foregoing and other objects in view there is additionally provided, in accordance with the invention, a process for producing a contact-making device for making contact between electrical components and lead-frames. The process includes the steps of: producing an electrical zero-insertion-force connector having at least one layer of an elastic dielectric coated on at least one of an upper side and an underside with an electrically conducting layer; structuring the elastic dielectric and the electrically conducting layer to form an area for a number of electrically conducting connections; forming the electrically conducting connections in the electrical zero-insertion-force connector; and applying a number of contact points to an upper side and an underside of the electrical zero-insertion-force connector, the contact points being connected to one another through the electrically conducting connections.

In accordance with an added mode of the invention, there is the step of providing at least two layers of the elastic dielectric with the electrically conducting layer on at least one of the upper side and the underside. Individual ones of the layers of the elastic dielectric are connected to one another after the structuring step to produce the electrical zero-insertion-force connector.

In accordance with an additional mode of the invention, there is the step of coating the upper side and/or the underside of the elastic dielectric with at least one photolithographic film.

In accordance with another mode of the invention, there is the step of performing the structuring step by laser structuring, photo-structuring, and/or etching-structuring.

In accordance with a further mode of the invention, there is the step of building up the contact points electrolytically on the upper side and the underside of the electrical zero-insertion-force connector.

In accordance with a concomitant feature of the invention, there is the step of making contacts via an electrolytical process between the two dielectric layers through the electrically conducting layer to form the electrical zero-insertion-force connector.

Other features which are considered as characteristic for the invention are set forth in the appended claims.

Although the invention is illustrated and described herein as embodied in a process for producing a contact-making device, in particular for making contact between electrical components and lead frames, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a sectional view of another embodiment of the contact-making device at its starting height before the contact-making; and FIG. 4 is a sectional view of the contact-making device according to FIG. 3 at its contact-making height after contact-making.

DESCRIPTION OF THE PREFERRED EMBODIMENTS

Figure 1:
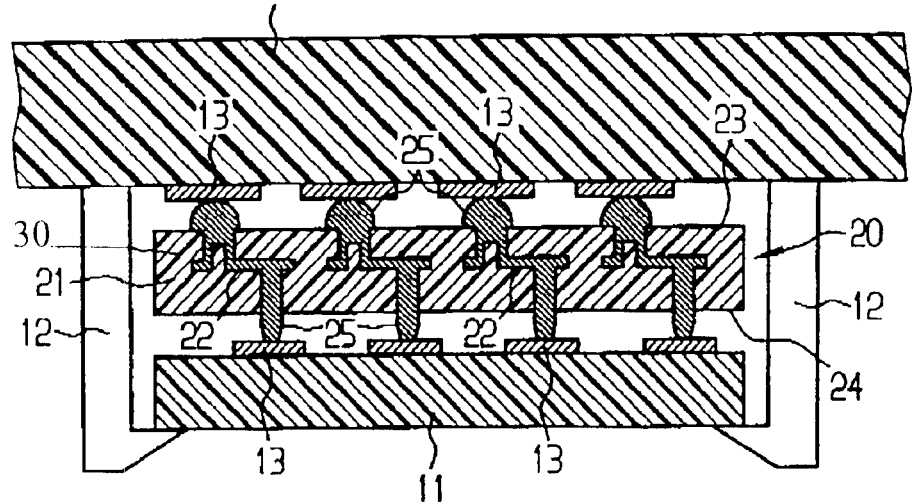
FIG. 1 is a diagrammatic, partial sectional view of a configuration of an electrical component and a lead frame between which contacts can be made by a contact-making device according to the invention.

In all the figures of the drawing, sub-features and integral parts that correspond to one another bear the same reference symbol in each case. Referring now to the figures of the drawing in detail and first, particularly, to FIG. 1 thereof, there is shown a printed-circuit board 10, for which contact with an electrical component 11 is made by a contact-making device 20. To produce an adequate contact force, holding elements 12 are provided on both sides of the contact-making device 20.

Both the printed-circuit board 10 and the electrical component 11 have a contact pattern with a multiplicity of contacts 13. The individual contacts 13 are connected to one another by the contact-making device 20.

For this purpose, the contact-making device 20 has an electrical zero-insertion-force connector 21, which has an elastic dielectric layer 30. Furthermore, the electrical zero-insertion-force connector 21 has a number of electrically conducting connections 22. The connections 22 respectively connect a number of contact points 25 that are disposed on an upper side 23 and an underside 24 of the electrical zero-insertion-force connector 21. The contact points 25 are respectively in connection with the contacts 13 of the printed-circuit board 10 and of the electrical component 11, whereby the making of releasable contacts between the component 11 and the printed-circuit board 10 is made possible. The contact points 25 protrude beyond the plane of the upper side 23 and underside 24, whereby it is also possible for contacts to be made in depressions of the corresponding electrical components 10, 11.

Figure 2:
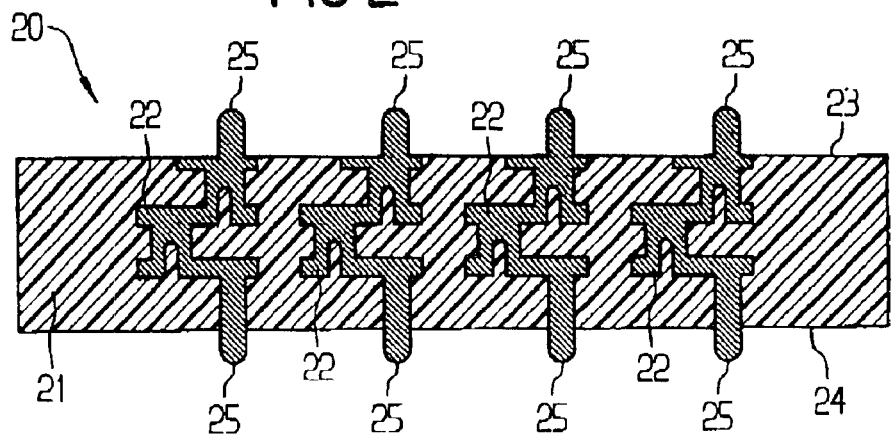
FIG. 2 is a sectional view of a further embodiment of the contact-making device.

Another embodiment of the contact-making device 20 is represented in FIG. 2. As in the case of the embodiment represented in FIG. 1, in FIG. 2 the contact points 25 that are disposed directly opposite one another on the upper side 23 and the underside 24 of the electrical zero-insertion-force connector 21 are respectively connected to one another via the connections 22. In contrast with FIG. 1, however, the connections 22 are configured differently, so that a different three-dimensional circuit system, formed by the connections 22, is obtained within the electrical zero-insertion-force connector 21. The configuration of the circuit systems that are suitable in each case depend on the application.

A further exemplary embodiment of a contact-making device 20 according to the invention is represented in FIGS. 3 and 4.

FIG. 3 shows the contact-making device 20 before the actual contact-making operation with a starting height "ha". The electrical zero-insertion-force connector 21 has a plurality of layers of the elastic dielectric 30. The individual dielectric layers 30 are respectively coated on their upper side and underside with a metal layer 27. In addition, the entire electrical zero-insertion-force connector 21 is coated on its upper side 23 and its underside 24 with a metal layer 26.

Furthermore, a multiplicity of the contact points 25 are provided on the upper side 23 and the underside 24 of the electrical zero-insertion-force connector 21. The individual metal layers 26 and 27 and also the dielectric layers 30 are structured and form a three-dimensional circuit system that contains the individual connections 22. Both the contact points 25 that are disposed on the respectively oppositely lying upper side 23 and underside 24 of the electrical zero-insertion-force connector 21 and the contact points 25 which are respectively disposed next to one another either on the upper side 23 or the underside 24 are connected to one another by the circuit system formed by the connections 22. This results in a contact-making device that is configured universally for various components with different connection patterns and contact areas. The special configuration of the three-dimensional circuit system allows the so-called "translator effect" to be produced, whereby contacts can be made between components and contact-making devices with different patterns of the contact points in a nevertheless satisfactory manner.

After contact-making and applying a suitable contact force, the contact-making device 20 is compressed into the contact-making height "he", as is represented in FIG. 4. The compressing of the electrical zero-insertion-force connector 21 has the effect that the connections 22 forming the three-dimensional circuit system are displaced. This results in a three-dimensional circuit system in which the contact points 25 respectively lying directly opposite one another on the upper side 23 and the underside 24 of the electrical zero-insertion-force connector 21 are electrically connected to one another via the connections 22 in the contact-making state.

If there is a smaller contact force or a contact force of varying intensity over the overall width of the contact-making device, it is at least possible in subregions of the electrical zero-insertion-force connector 21 to produce a circuit system in which neighboring one of the contact points 25 or the contact points 25 disposed offset in relation to one another are also connected to one another via the connections 22. This allows the structure of the three-dimensional circuit system formed by the connections 22 in the electrical zero-insertion-force connector 21 to be set according to requirements, and changed if appropriate, via the elasticity of the dielectric layer 30, and consequently of the electrical zero-insertion-force connector 21, and also via the intensity of the contact force acting.

An example of a process for producing the contact-making device 20 according to the invention is described below. First, the metal layer 26 is provided in the form of a thin copper foil 26. The thin copper foil 26 is coated with a liquid silicone rubber or polyurethane as the dielectric layer 30. The coating may take place by casting (as in the case of solder resist), spraying, centrifuging, rolling or the like. Subsequently, the other metal layer 27 being a second copper foil 27 is laminated onto the still liquid dielectric 30. As an alternative to this, a copper layer may also be applied to an already cured dielectric 30. Subsequently, the elastic dielectric 30 is cured. Thereafter, the area for the connections 22—also known as micro-vias—are introduced into the copper foils 26, 27 and the dielectric by laser structuring—for example by laser drilling—to produce a first plated-through level. In addition, the metal layers 26, 27 may also be photo-structured or etching-structured. The connections 22 are thereby formed in the structured layer structure formed in and of the metal layers 26, 27 and the dielectric layer 30.

Depending on requirements, the process steps described so far may be repeated a number of times to produce thicker contact-making devices 20. The electrical zero-insertion-force connector 21 with the structure represented in FIG. 3 is produced. Once the dielectric layers 30 have cured, the dielectric layer 30 last applied, that is to say the dielectric layer 30 lying on the outside, is coated with one or more layers of photolithographic film. The photolithographic films and, according to requirements, the dielectric layers 30, are laser-structured to allow the formation of the connections 22. Subsequently, the contacts 25 are electrolytically applied to the upper side 23 and the underside 24 of the electrical zero-insertion-force connector 21 and are electrolytically plated with a gold layer 31. Then, one or more photolithographic films are applied to the upper side 23 and the underside 24 of the electrical zero-insertion-force connector 21. These photolithographic films serve on the one hand as protection for the contacts, and on the other hand as the starting material for the subsequent production of the contact points 25.

The photolithographic films are then laser-structured to produce the contact points 25. Subsequently, the contact points 25 are built up electrolytically on the contacts and then electrolytically gold-plated. The photolithographic films are stripped and subsequently a final etching-structuring of the upper side 23 and the underside 24 is performed. The resulting contact-making device 20 can be used for making contacts between different electrical components.

I claim:

1. A process for producing a contact-making device for making electrical contact between components, which comprises the steps of:
   providing a basic metal layer, the basic metal layer being a metal foil;
   alternatingly applying at least one dielectric layer of elastic dielectric material and at least one further metal layer of metal foil on the basic metal layers;
   structuring the layers with holes to form vertical vias or through contacts;
   structuring the basic metal layer and the uppermost metal layer to form exterior contacts; and
   the elastic dielectric material forming a main body of the contact-making device.

2. The process according to claim 1, which comprises producing a multilayer interposer including at least two elastic dielectric layers between metal foils.

3. The process according to claim 1, which comprises applying the dielectric layer as a coating of liquid silicone rubber or polyurethane.

* * * * *